US012642034B2

(12) United States Patent　　　　　　(10) Patent No.:　　US 12,642,034 B2
Kim et al.　　　　　　　　　　　　　　(45) Date of Patent:　　　May 26, 2026

(54) SUBSTRATE PROCESSING APPARATUS

(71) Applicant: APET CO., LTD., Pyeongtaek-si (KR)

(72) Inventors: Tae Woo Kim, Hwaseong-si (KR);
　　　　　　　Sang Su Lee, Osan-si (KR); **Jae Hoon
　　　　　　　Hwang**, Yongin-si (KR)

(73) Assignee: APET CO., LTD., Pyeongtaek-si (KR)

( * ) Notice:　　Subject to any disclaimer, the term of this
　　　　　　　patent is extended or adjusted under 35
　　　　　　　U.S.C. 154(b) by 70 days.

(21) Appl. No.: 18/672,537

(22) Filed:　　May 23, 2024

(65)　　　　　　Prior Publication Data

US 2024/0404842 A1　　Dec. 5, 2024

(30)　　　Foreign Application Priority Data

Jun. 1, 2023　(KR) ........................ 10-2023-0070995

(51) Int. Cl.
　　H10P 72/00　　　　(2026.01)
(52) U.S. Cl.
　　CPC ................................ H10P 72/0402 (2026.01)
(58) Field of Classification Search
　　None
　　See application file for complete search history.

(56)　　　　　　References Cited

FOREIGN PATENT DOCUMENTS

JP　　　2006-024793 A　　1/2006
JP　　　2008-108790 A　　5/2008

KR　　　　10-1058835 B1　　8/2011
KR　　　　10-1927919 B1　　12/2018
KR　　　　10-2265121 B1　　6/2021
KR　　10-2022-0146051 A　　11/2022
KR　　　　10-2523645 B1　　4/2023
KR　　10-2023-0158829 A　　11/2023
KR　　　　10-2616246 B1　　12/2023

OTHER PUBLICATIONS

Office Action was issued in Korean Patent Application No. 10-2023-0070995 on Oct. 31, 2024, including English translation, 10pp.

*Primary Examiner* — Levon J Shahinian

(74) *Attorney, Agent, or Firm* — Womble Bond Dickinson (US) LLP

(57)　　　　　　ABSTRACT

The present disclosure provides a substrate processing apparatus provided with a rotating table for supporting and rotating a substrate and collection cups for collecting treatment solutions sprayed onto the substrate, which includes the collection cups disposed outside the rotating table and each provided therein with a space for collecting the treatment solution, one pair of lifting shafts connected to each of the collection cups, and one pair of driving modules connected to each of the lifting shafts, wherein an outermost third driving part among the driving modules is a motor driving type, an inner driving module disposed inside the third driving part is a hydraulic driving type, and a liftable height of a third collection cup connected to the third driving part and lifted by a third lifting shaft is higher than a liftable height of a collection cup lifted by the inner driving module.

7 Claims, 16 Drawing Sheets

FIG. 16

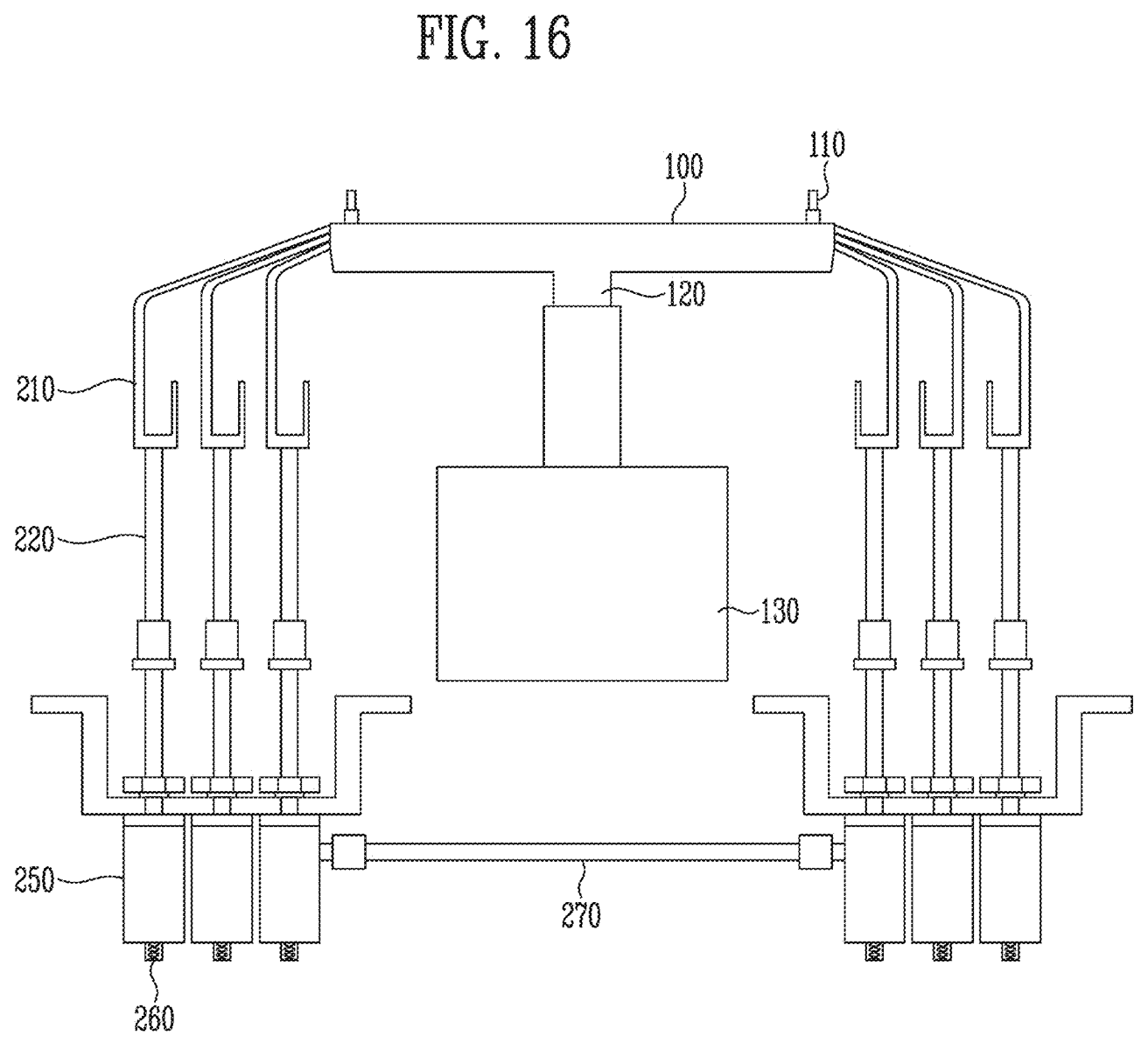

SUBSTRATE PROCESSING APPARATUS

CROSS-REFERENCE TO RELATED APPLICATION

This application claims priority to and the benefit of Korean Patent Application No. 10-2023-0070995, filed on Jun. 1, 2023, the disclosure of which is incorporated herein by reference in its entirety.

BACKGROUND

1. Field of the Disclosure

The present disclosure relates to an apparatus for processing a semiconductor substrate.

2. Discussion of Related Art

A semiconductor manufacturing process may include various processes for performing deposition, photography, etching, cleaning on a semiconductor substrate. A substrate processing process is for supplying various treatment solutions onto a substrate and may preferably include a process of spraying two or more treatment solutions to a rotating substrate according to a preset order and flow rate.

The treatment solutions sprayed onto the substrate may be discharged to the outside of a substrate processing apparatus or stored and then collected for reuse. To this end, a collection cup structure with a space for collecting a treatment solution was adopted in the conventional substrate processing apparatus. The treatment solution sprayed onto the substrate may move outward from the substrate according to the rotation of the substrate, and the collection cup was provided to surround the outside of the substrate to collect the treatment solution.

A structure in which the collection cup is provided as a plurality of collection cups to prevent different treatment solutions from being mixed and collected is adopted, and the collection cups are each connected to a pneumatic cylinder and lifted and lowered. In this case, the pneumatic cylinder is a unit which controls a predetermined height of the collection cup to be adjusted to correspond to a movement direction of the treatment solution and a height of the remaining collection cups to be adjusted differently to collect the predetermined treatment solutions.

However, the conventionally used pneumatic cylinder method had a problem that an error occurs in height adjustment of the collection cups due to an internal factor such as friction occurring in a process of lifting or lowering the collection cups and a problem that an error occurs in height adjustment and balance maintenance of the collection cups due to external factors such as a weight change according to the collection of the treatment solutions in the collection cups and an inappropriate response for weight unbalance when the treatment solution is concentrated at any one side in the collection cup, or the like. Since such errors become severe as the substrate processing process is performed more and more, there was a limit that greater maintenance time and costs are required.

In addition, in the case of a hydraulic driving type using a pneumatic cylinder, there was a disadvantage due to a fact that only one of both operations of lifting a collection cup to an uppermost end and lowering the collection cup to a lowermost end should be chosen since adjustment for a middle height between an uppermost height and a lowermost height was impossible in a process of adjusting a height of the collection cup to be lifted or lowered.

SUMMARY OF THE INVENTION

The present disclosure is directed to providing a substrate processing apparatus capable of adjusting a height of an outermost collection cup among a plurality of collection cups to a middle height instead of performing one of the conventional lifting and lowering operations by adjusting a height of the collection cup using a motor method rather than a hydraulic driving method and increasing a liftable height of the outermost collection cup to be higher than that of the collection cups disposed thereinside so that the outermost collection cup collects a scattering chemical solution.

According to an aspect of the present disclosure, there is provided a substrate processing apparatus provided with a rotating table for supporting and rotating a substrate and collection cups for collecting treatment solutions sprayed onto the substrate, which includes the collection cups disposed outside the rotating table and each provided therein with a space for collecting the treatment solution, one pair of lifting shafts connected to each of the collection cups, and one pair of driving modules connected to each of the lifting shafts, wherein an outermost third driving part among the driving modules is a motor driving type, an inner driving module disposed inside the third driving part is a hydraulic driving type, and a liftable height of a third collection cup connected to the third driving part and lifted by a third lifting shaft is higher than a liftable height of a collection cup lifted by the inner driving module.

The inner driving module may include a second driving part disposed inside the third driving part and a first driving part disposed inside the second driving part.

The collection cup may include a second collection cup connected to the second driving part through a second lifting shaft and disposed inside the third collection cup and a first collection cup connected to the first driving part through a first lifting shaft and disposed inside the second collection cup to surround the rotating table.

Height adjustment of the third collection cup in three or more stages may be allowed through the third driving part.

The one pair of lifting shafts may be synchronized with each other to lift or lower the one pair of lifting shafts at the same time to adjust a relative height of the collection cup with respect to the rotating table.

One end of each of the one pair of lifting shafts may be connected to a lower surface of the collection cup, and the other end of each of the one pair of lifting shafts may be connected to an upper surface the driving modules.

The third driving part may include a motor which generates driving power, a screw that is connected to the motor and rotates about a rotating axis perpendicular to a rotating shaft of the motor, a lifting plate which is screw-coupled to the screw and to which the other end of the lifting shaft is connected, and a nut which suppresses rotation of the lifting plate, wherein the third lifting shaft may be lifted or lowered by adjusting a relative height of the lifting plate with respect to the screw.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which:

3

Figure 1:
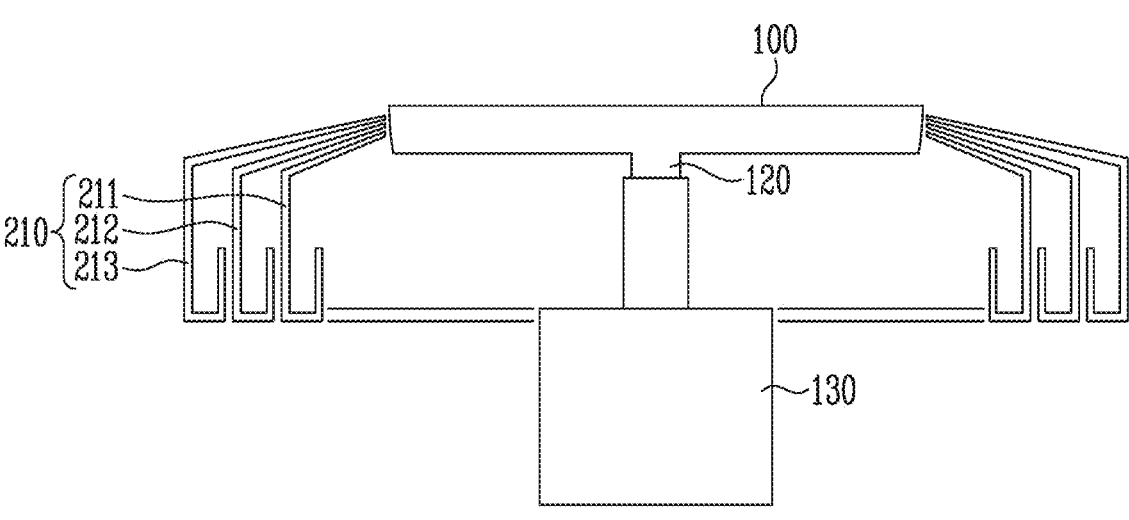
Figure 2:
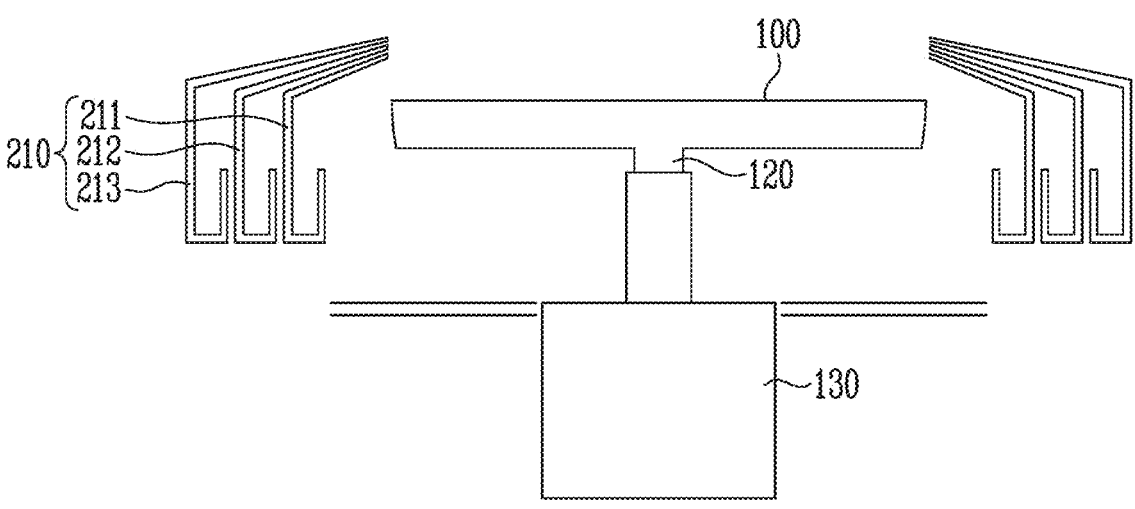
Figure 3:
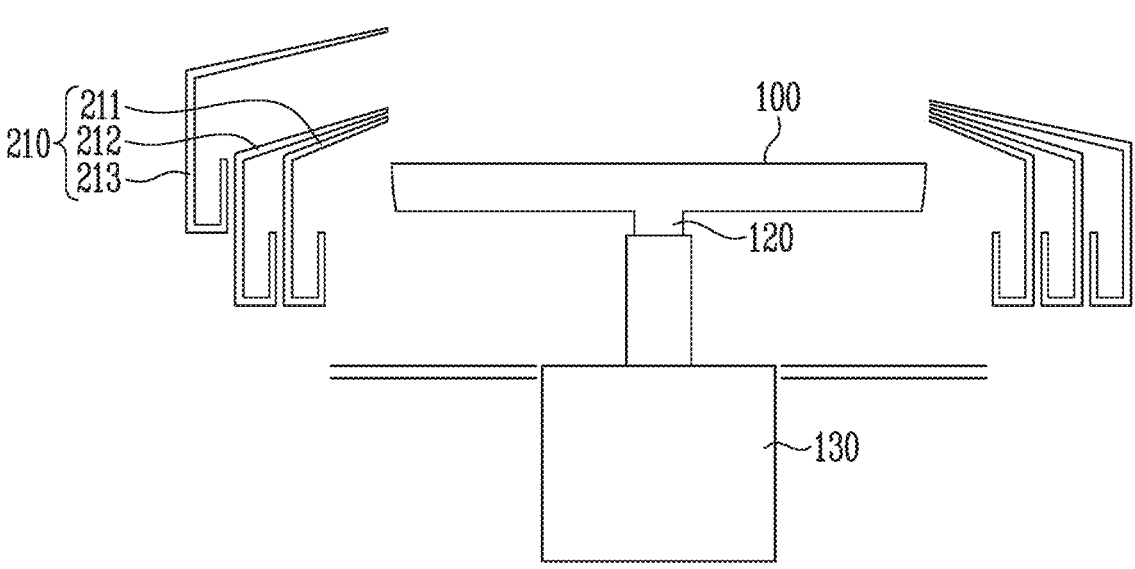
Figure 4:
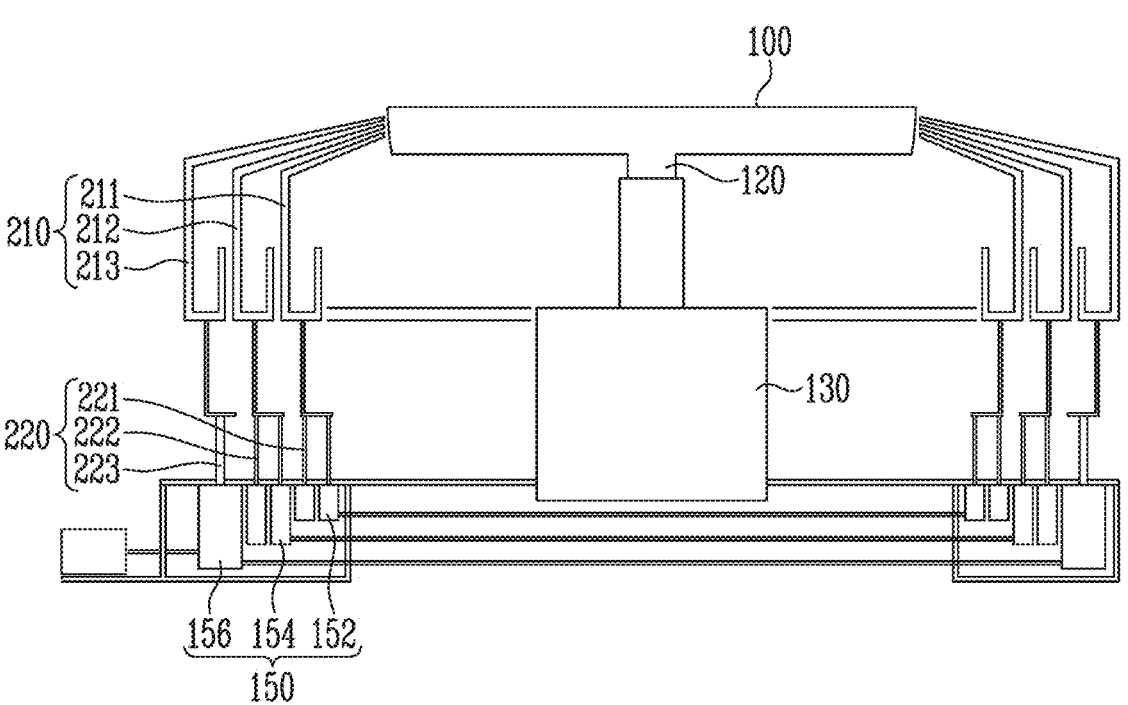
Figure 5:
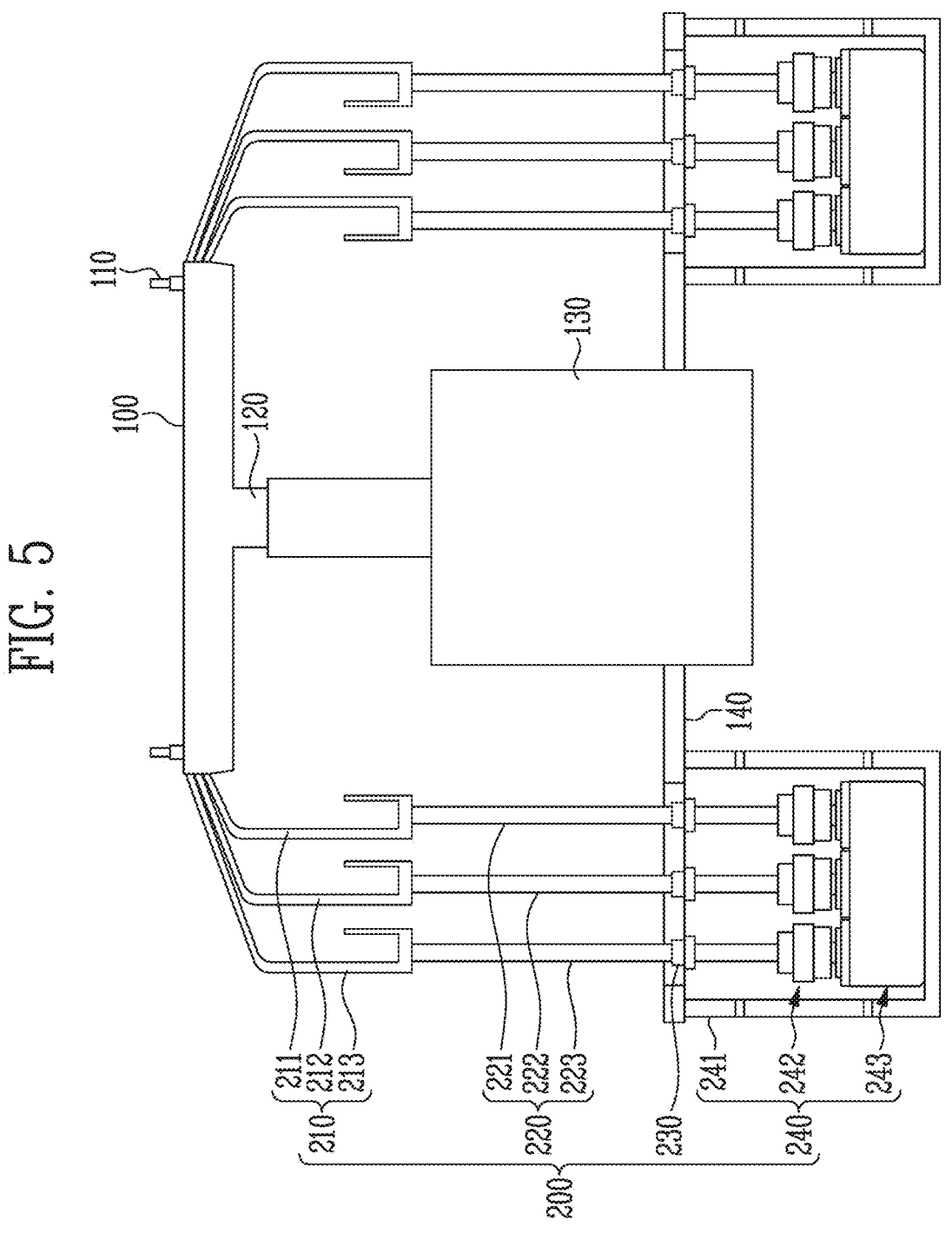
Figure 6:
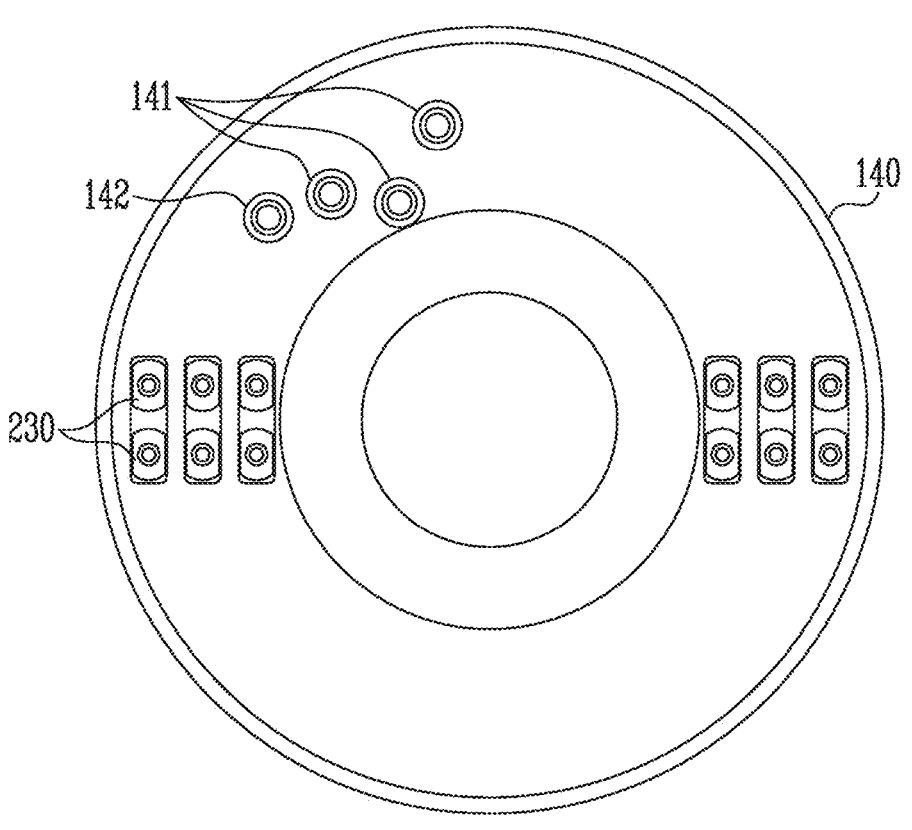
Figure 7:
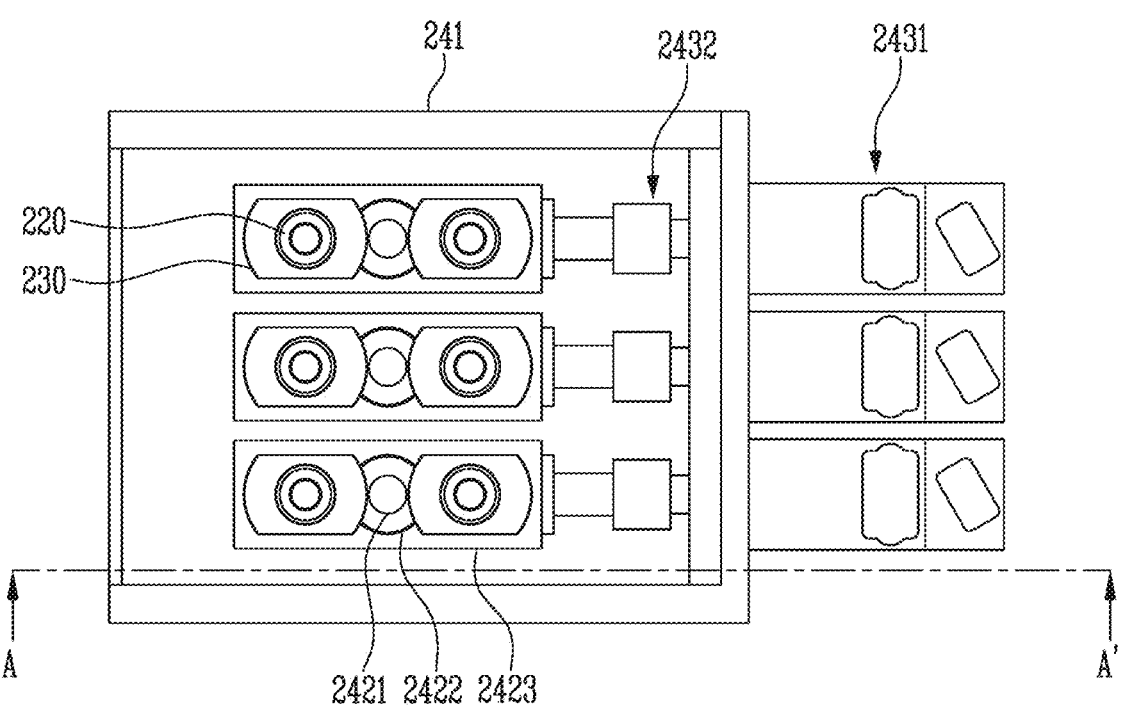
Figure 8:
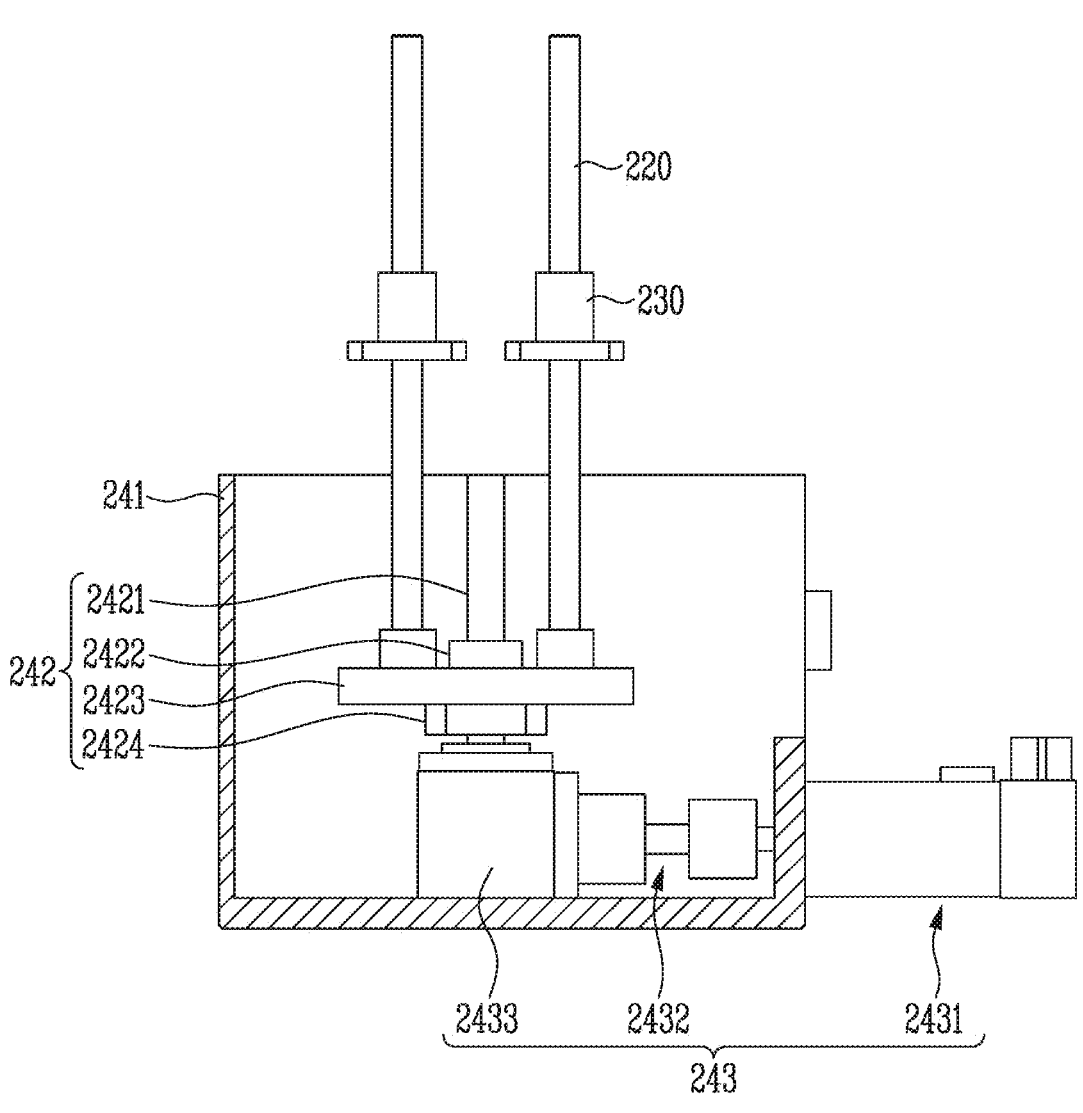
Figure 9:
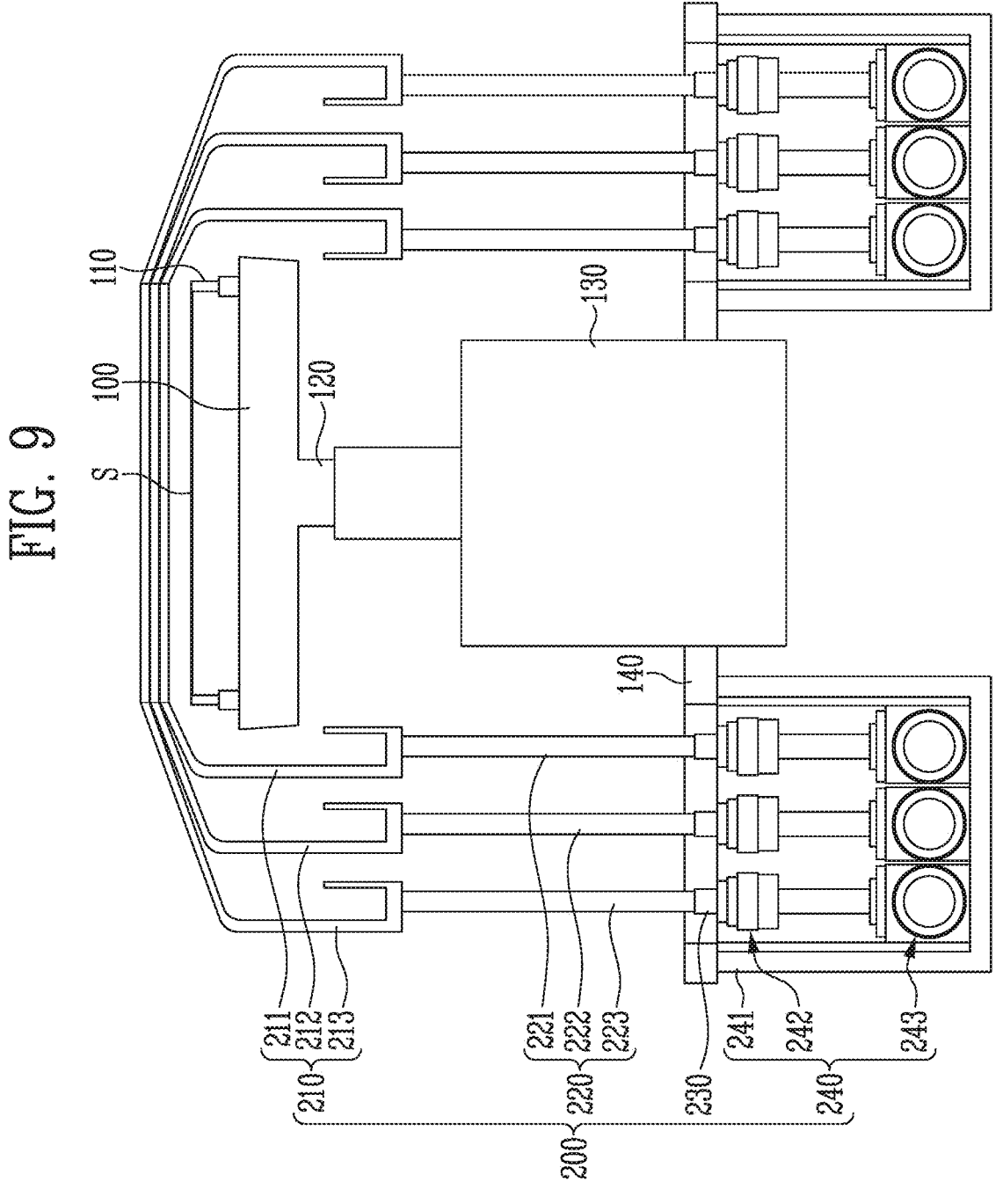
Figure 10:
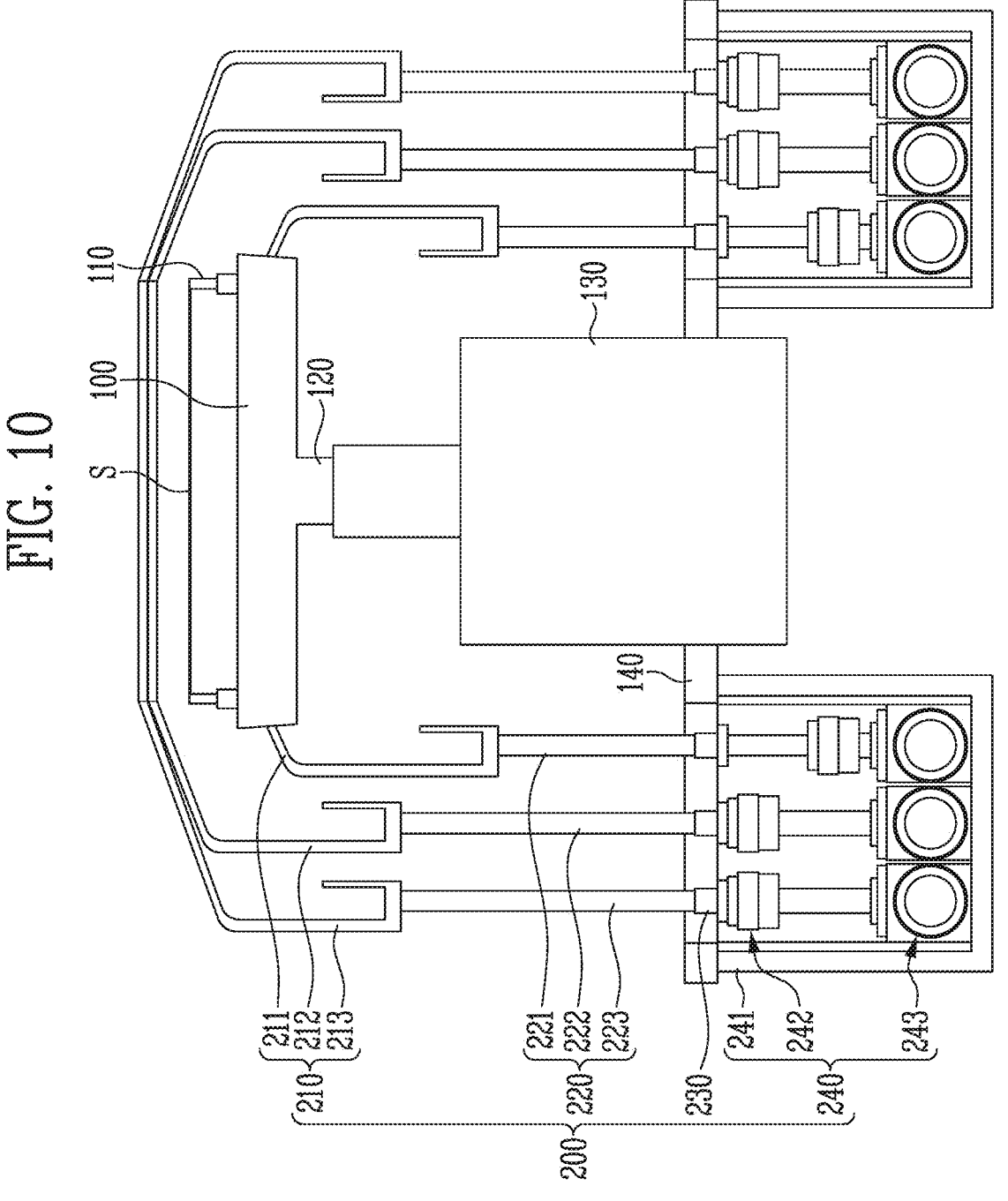
Figure 11:
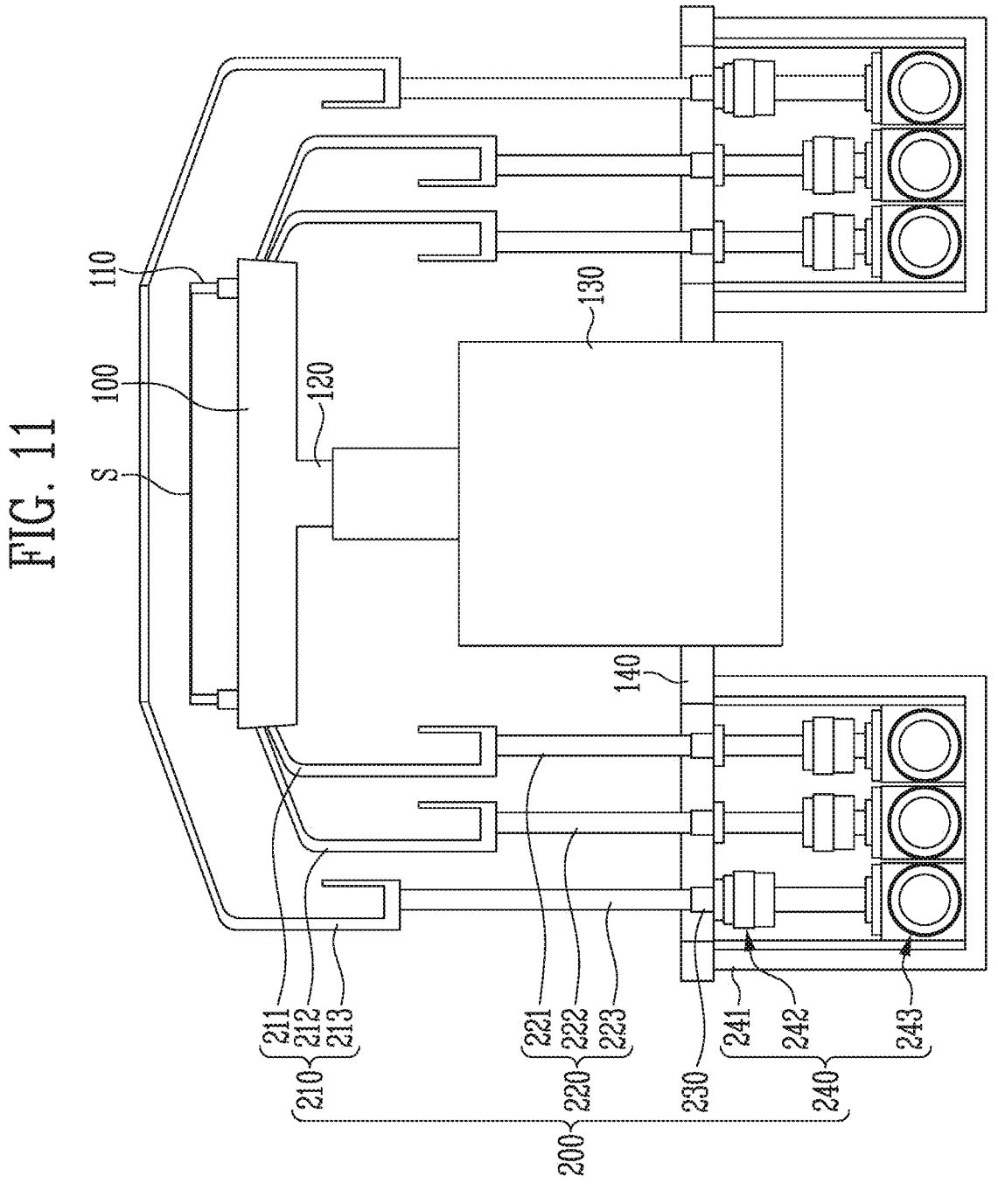
Figure 12:
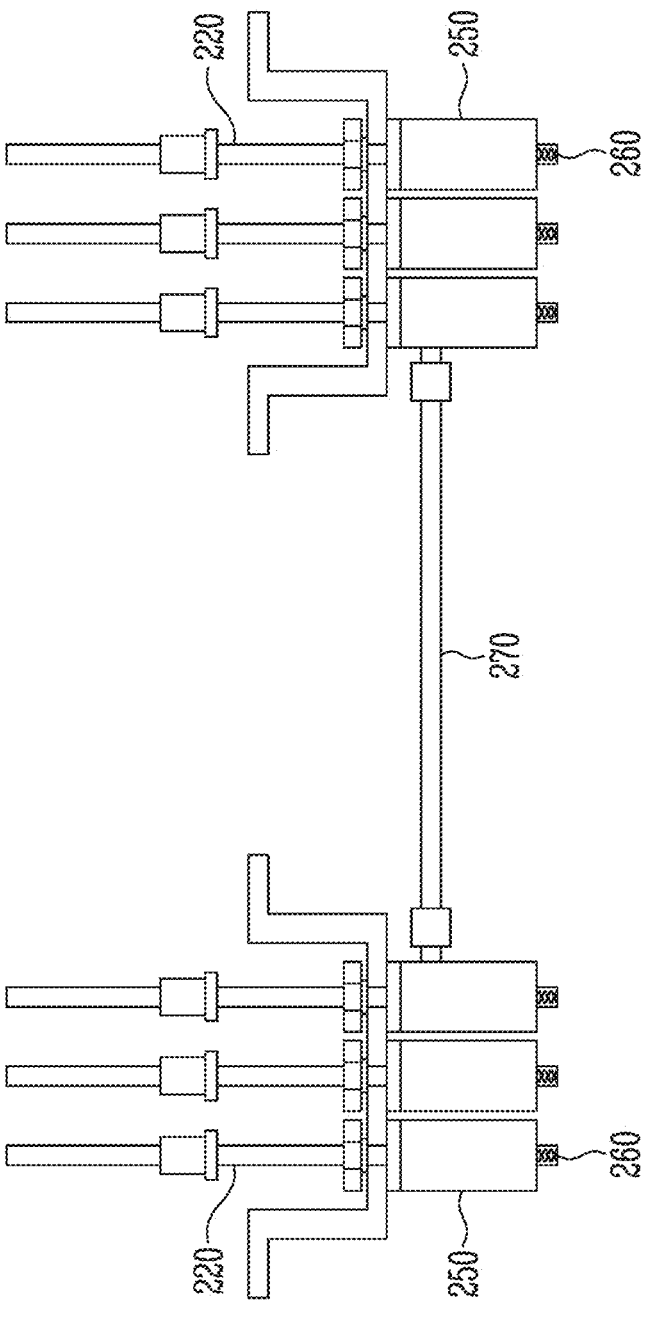
Figure 13:
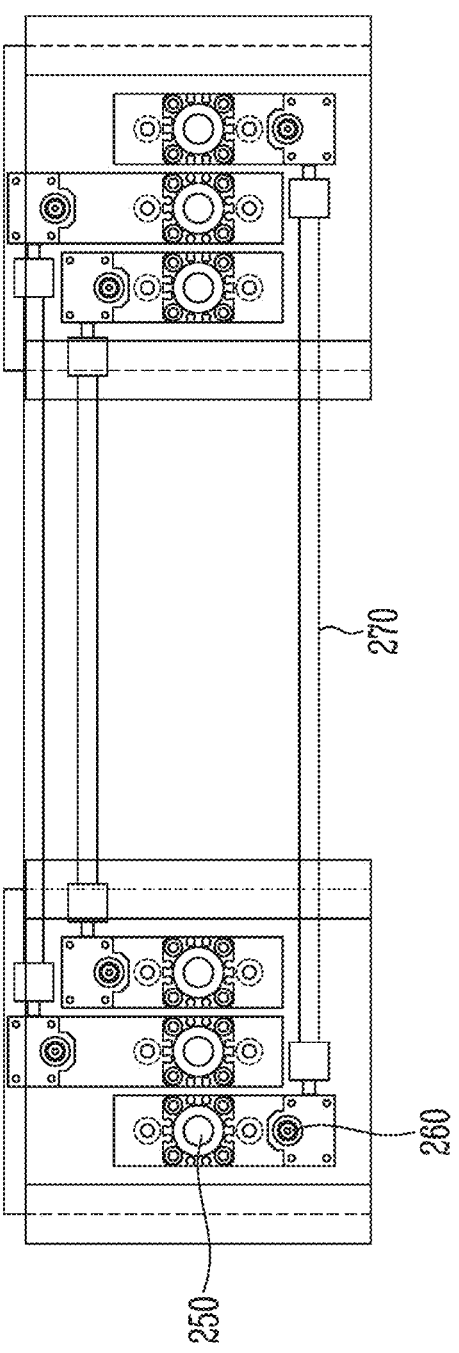
Figure 14A:
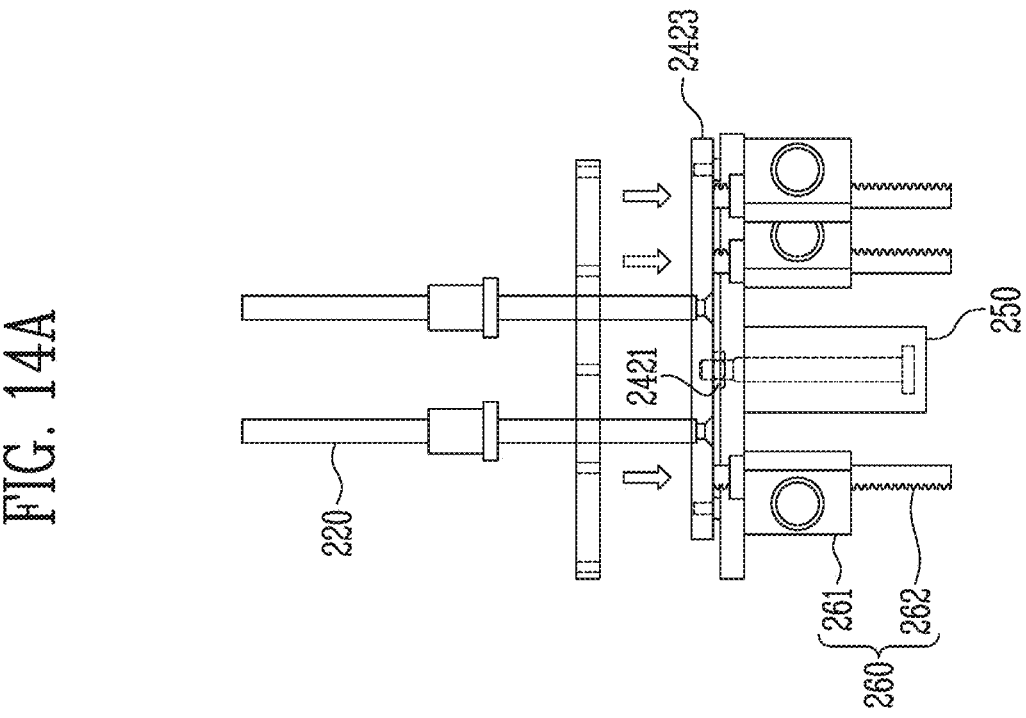
Figure 14B:
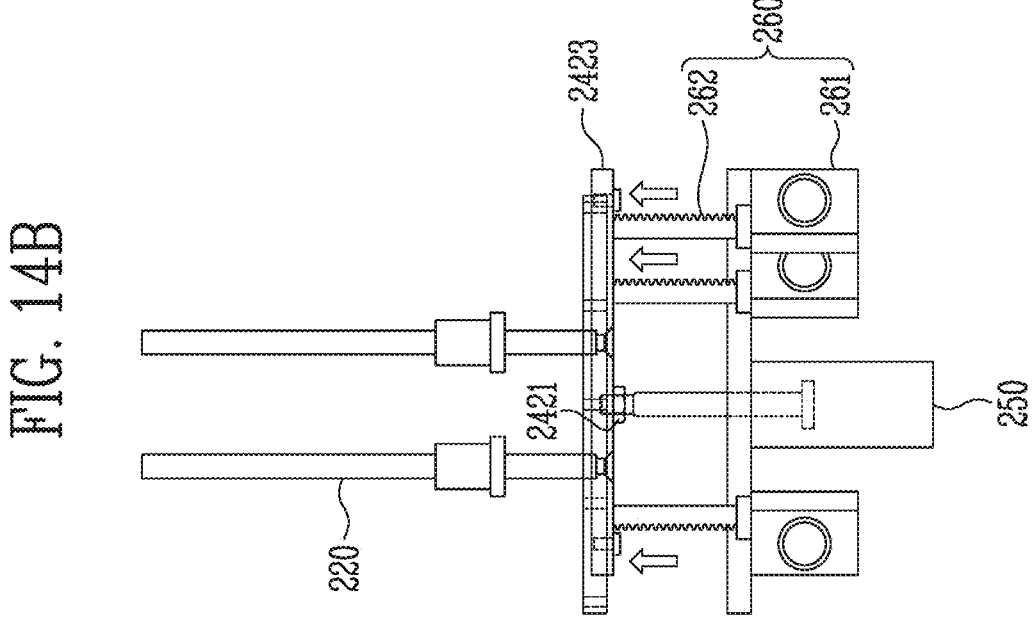
Figure 15:
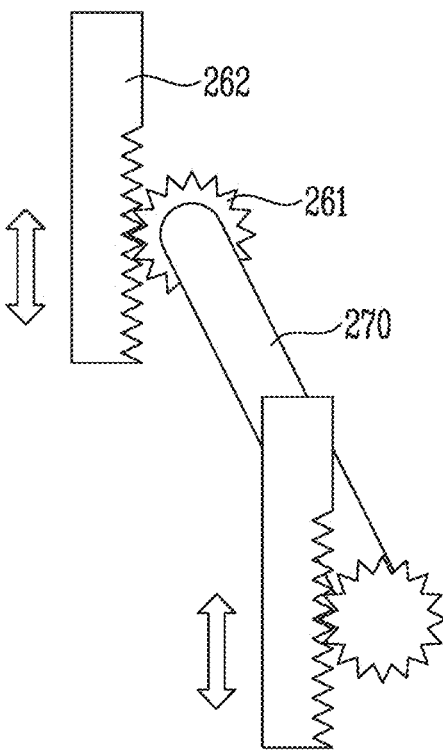

FIG. 1 is a cross-sectional view illustrating one cross section of a substrate processing apparatus according to one embodiment of the present disclosure;

FIG. 2 is a cross-sectional view illustrating one cross section of the substrate processing apparatus according to one embodiment of the present disclosure;

FIG. 3 is a cross-sectional view illustrating one cross section of the substrate processing apparatus according to one embodiment of the present disclosure;

FIG. 4 is a cross-sectional view illustrating one cross section of the substrate processing apparatus according to one embodiment of the present disclosure;

FIG. 5 is a cross-sectional view illustrating one cross section of a substrate processing apparatus according to another embodiment of the present disclosure;

FIG. 6 is a conceptual view illustrating one surface of a housing of the substrate processing apparatus according to another embodiment of the present disclosure;

FIG. 7 is a plan view illustrating a gear box of the substrate processing apparatus according to another embodiment of the present disclosure;

FIG. 8 is a cross-sectional view illustrating the gear box along a virtual line AA' shown in FIG. 7;

FIG. 9 is a cross-sectional view illustrating a collection operation of a first collection cup in the substrate processing apparatus according to another embodiment of the present disclosure;

FIG. 10 is a cross-sectional view illustrating a collection operation of a second collection cup in the substrate processing apparatus according to another embodiment of the present disclosure;

FIG. 11 is a cross-sectional view illustrating a collection operation of a third collection cup in the substrate processing apparatus according to another embodiment of the present disclosure;

FIG. 12 is a view illustrating one cross section of a substrate processing apparatus according to still another embodiment of the present disclosure;

FIG. 13 is a top view illustrating the substrate processing apparatus according to still another embodiment of the present disclosure;

FIGS. 14A and 14B are exemplary views illustrating a state in which the substrate processing apparatus is driven according to still another embodiment of the present disclosure;

FIG. 15 is a view illustrating a state in which a connecting shaft is synchronously engaged with a rack in the substrate processing apparatus according to still another embodiment of the present disclosure; and FIG. 16 is a view illustrating a state in which a collection cup is connected to the substrate processing apparatus according to still another embodiment of the present disclosure.

DETAILED DESCRIPTION OF EXEMPLARY EMBODIMENTS

Hereinafter, objectives, specific advantages, and novel features of the disclosure will be clear from the following detailed description, exemplary embodiments, and the accompanying drawings. However, the embodiments and the drawings are for exemplary describing the present disclosure, and the scope the present disclosure is not limited thereto. In addition, in the description of the disclosure, when it is determined that detailed descriptions of related well-known functions unnecessarily obscure the gist of the disclosure, the detailed descriptions thereof will be omitted.

Hereinafter, the inclusive meaning of a substrate is a means which is provided to form semiconductor functional layers by growing semiconductor raw materials on a surface thereof and to which the semiconductor functional layers are fixed.

Hereinafter, the inclusive meaning of "processing a substrate" is "a process of forming a functional layer including a target material on a substrate using a treatment solution" or "a process of removing impurities or contaminants other than target materials."

Hereinafter, treatment solutions may mean those commonly used in the art, and first to third treatment solutions mean that the first to third treatment solutions are collected through specific collection cups so that the treatment solutions are not mixed with each other and do not mean that each of the first to third treatment solutions is necessarily a single type treatment solution.

Hereinafter, exemplary embodiments of the present disclosure will be described in detail with reference to the accompanying drawings.

The present disclosure is characterized by allowing a height of an outermost third collection cup 213 among a plurality of collection cups 210 included in a substrate processing apparatus 1 to be adjusted by a motor method rather than a hydraulic driving method.

Unlike inner collection cups 211 and 212 which are adjustable only in two stage, that is, an upper stage and a lower stage, through a hydraulic driving method, the outermost third collection cup 213 is adjustable using a motor so that step-by-step lifting or lowering adjustment is possible, a liftable height of the outermost third collection cup 213 is higher than those of the collection cups 211 and 212 disposed thereinside, and thus there is a scattering prevention effect that the outermost third collection cup 213 can receive a chemical solution.

Hereinafter, a driving method of the collection cup of the substrate processing apparatus according to one embodiment of the present disclosure will be described with reference to FIGS. 1 to 4.

FIG. 1 is a cross-sectional view illustrating one cross section of a substrate processing apparatus according to one embodiment of the present disclosure.

FIG. 2 is a cross-sectional view illustrating one cross section of the substrate processing apparatus according to one embodiment of the present disclosure.

FIG. 3 is a cross-sectional view illustrating one cross section of the substrate processing apparatus according to one embodiment of the present disclosure.

FIG. 4 is a cross-sectional view illustrating one cross section of the substrate processing apparatus according to one embodiment of the present disclosure.

Specifically, FIGS. 1 to 3 are views for describing a lifted state of a collection cup 210 in a substrate processing apparatus 1 according to the present disclosure, and FIG. 4 is a view for describing a driving module 150 formed using a motor driving type and a hydraulic driving type.

As illustrated in FIGS. 1 to 4, the substrate processing apparatus 1 according to one embodiment of the present disclosure is provided with a rotating table 100 which supports and rotates a substrate and a collection cup 210 which collects a treatment solution sprayed to the substrate. The substrate processing apparatus 1 may include collection cups 210 which are disposed outside the rotating table 100 and provide spaces for collecting treatment solutions therein, one pair of lifting shafts 220 connected to each of the collection cups 210, and one pair of driving modules 150 connected to each of the lifting shafts 220.

Particularly, among the plurality of driving modules 150, an outermost third driving part 156 is a motor driving type, and a plurality of inner driving modules (For example, a second driving part 154 and a first driving part 152) disposed inside the third driving part 156 are hydraulic driving types.

A motor may be used instead of the conventional pneumatic cylinder to more precisely control a height of a collection cup, and even when the motor is repeatedly used, an error does not occur, or an error can be easily corrected.

In addition, it is characterized that a liftable height of the third collection cup 213, which is connected to and lifted by the third driving part 156 through a third lifting shaft 223, is higher than liftable heights of the plurality of collection cups 211 and 212 lifted by the driving modules 150 disposed inward, that is, a first driving part 152 and a second driving part 154.

The driving modules 150 of the present disclosure may include the outermost third driving part 156, the second driving part 154 disposed inside the third driving part 156, and the first driving part 152 disposed inside the second driving part 154, and the driving parts 152, 154, and 156 may be connected to the collection cups 211, 212, and 213 by the lifting shafts 221, 222, and 223, respectively.

Specifically, in the collection cups 210 of the present disclosure, there are a first collection cup 211, a second collection cup 212, and a third collection cup 213. The collection cups 210 may include the third collection cup 213 which is connected to and lifted by the third driving part 156 by the outermost third lifting shaft 223, the second collection cup 212 connected to the second driving part 154 by a second lifting shaft 222 and disposed inside the third collection cup 213, and the first collection cup 211 connected to the first driving part 152 by a first lifting shaft 221 and disposed inside the second collection cup 212 to surround the rotating table 100.

A lifting process of the collection cups 210 in FIGS. 1 to 4 will be described according to the above-described arrangement of the plurality of collection cups 210, the lifting shafts 220, and the driving modules 150 according to one embodiment of the present disclosure.

First, FIG. 1 is the view illustrating a state in which all the collection cups 211, 212, and 213 are lowered.

The outermost third collection cup 213 is disposed to overlap the first collection cup 211 and the second collection cup 212 disposed inside the third collection cup 213 side by side around a level of the rotating table 100.

FIG. 2 is a view illustrating a state in which all the first collection cup 211, the second collection cup 212, and the third collection cup 213 are lifted as compared to FIG. 1.

It may be seen that all the first collection cup 211, the second collection cup 212, and the third collection cup 213 overlap, are lifted, and are disposed at a higher level than the rotating table 100 disposed thereinside.

FIG. 3 is a view illustrating a state in which the outermost third collection cup 213 is lifted further compared to FIG. 2. When a height of the third collection cup 213 in FIG. 1 is defined as a first stage, a height thereof in FIG. 2 is defined as a second stage, and a height thereof in FIG. 3 is defined as a third stage viewed from a side of the third collection cup 213, the three-stage height adjustment is possible for the third collection cup 213.

However, only one-stage or two-stage height adjustment that is possible for the first collection cup 211 and the second collection cup 212 disposed inside the third collection cup 213 as in FIGS. 1 and 2 may be a characteristic of the present disclosure compared to the conventional technology. That is, according to one embodiment of the present disclosure, three or more-stage height adjustment is possible for the third collection cup 213 using the third driving part 156 in the motor driving type.

FIG. 4 is a view illustrating a driving method according to one embodiment of the present disclosure, which illustrates a difference in driving method for height adjustment of the third collection cup 213 different from those of the first collection cup 211 and the second collection cup 212.

The driving modules 150 according to the present disclosure include the first driving part 152, the second driving part 154, and the third driving part 156, a structure of the outermost third driving part 156 and structures of the first driving part 152 and the second driving part 154 disposed inside the third driving part 156 are different.

As illustrated in the drawings, any one of lifting and lowering operations may be selected by the first driving part 152 and the second driving part 154 and performed in the hydraulic driving type using a cylinder. However, as illustrated in the drawings, the third driving part 156 is the motor driving type and may perform precise control and increase a lifting height using the motor compared when the cylinder is used.

As described above, when the third collection cup 213 is lifted using the motor, in the case of a process in which a chemical solution explosively reacts, the scattering chemical solution may be collected in the third collection cup 213 lifted one stage higher than the first collection cup 211 and the second collection cup 212 as in FIG. 3, and thus there is an effect of preventing external contamination.

The third driving part 156 of the present disclosure may include a motor (not shown) which generates driving power, a screw (not shown) which is connected to the motor (not shown) and rotates about a rotating axis perpendicular to a rotating shaft (not shown) of the motor (not shown), a lifting plate (not shown) which is screw-coupled to the screw and to which the other end of the lifting shaft is connected, and a nut (not shown) which suppresses rotation of the lifting plate and lift and lower the third lifting shaft 223 by adjusting a relative height of the lifting plate with respect to the screw, and the rotating axis of the screw and the third lifting shaft 223 may be disposed parallel to each other. A motor driving method of the third driving part 156 will be described in detail with reference to following FIG. 5 to FIG. 11.

In addition, one pair of lifting shafts 220 according to the present disclosure may have a structure in which one ends are connected to a lower surface of the collection cup 210 and the other ends are connected to an upper surface of the driving module 150, and a relative height of the collection cup 210 with respect to the rotating table 100 may be adjusted by lifting or lowering the synchronized pair of lifting shafts 220.

FIGS. 5 to 11 correspond to another embodiment in which a driving method for lifting is different from that of FIGS. 1 to 4 described above.

A related configuration including a motor driving type in contents in FIG. to FIG. 11 may be equally applied to the embodiment of FIGS. 1 to 4.

A substrate processing apparatus according to another embodiment of the present disclosure will be described with reference to FIGS. 5 and 6.

FIG. 5 is a cross-sectional view illustrating a side surface of a substrate processing apparatus 1 according to one embodiment of the present disclosure, which is a conceptual view illustrating a state in which a substrate is not loaded and all collection cups, which will be described below, are lowered. FIG. 6 is a conceptual view illustrating one surface of a housing of the substrate processing apparatus 1 according to one embodiment of the present disclosure.

Specifically, FIG. 6 is a conceptual view illustrating a state, in which a rotation driving part 130 is connected to a central portion of a housing 140, and one surface in which openings through which lifting shafts 220 pass are formed outside the rotation driving part 130.

Referring to FIG. 5, the substrate processing apparatus 1 may include a rotating table 100, a chuck pin 110, a rotating shaft 120, the rotation driving part 130, the housing 140, a treatment solution collecting part 200, and the like.

One surface of the rotating table 100 provides a portion on which the substrate is loaded. The rotating table 100 may be provided with a plurality of chuck pins 110 radially disposed around the rotating shaft 120. The chuck pins 110 may be disposed to protrude and extend from the one surface of the rotating table 100, and the substrate may be loaded between the plurality of chuck pins 110. The substrate may be attached thereto and detached therefrom at a level spaced a predetermined distance from the one surface of the rotating table 100 by the chuck pins 110, and as the rotating table 100 rotates, the substrate may be rotated together therewith while fixed to the chuck pins 110.

The rotating table 100 may have a disc shape but is not limited thereto. The rotating table 100 may be connected to the rotation driving part 130 through the rotating shaft 120 provided at the center thereof, and the rotation driving part 130 may include a motor and the like and rotate the rotating table 100. Preferably, the rotating shaft 120 may be parallel to a height direction of the substrate processing apparatus 1.

Although not illustrated in the drawings, the housing 140 of the substrate processing apparatus 1 may provide a space for arranging the rotating table 100, the rotation driving part 130, and the treatment solution collecting part 200 therein. The housing 140 may be connected to the rotation driving part 130 and the treatment solution collecting part 200, the rotating table 100 may be provided to be externally exposed from the housing 140, but the present disclosure is not limited thereto.

The treatment solution collecting part 200 includes a collection cup 210, a lifting shaft 220, a separation prevention member 230, a gear box 240, and the like, and controls the collection cup 210 to be lifted or lowered to collect a treatment solution.

The collection cup 210 may be disposed outside the rotating table 100 and may provide an internal space for collecting the treatment solution. Preferably, the collection cup 210 may extend along an edge of the rotating table 100 to surround the rotating table 100 and have a shape of which an upper surface is open to expose the rotating table 100 as the collection cup 210 is lifted or lowered. For example, when the rotating table 100 has the disc shape, the collection cup 210 may be provided in a ring shape to surround the rotating table 100 formed in the disc shape in a top view.

When the collection cup 210 is completely lifted, the collection cup 210 may receive and collect a treatment solution moving outward from the rotating shaft 120 of the rotating table 100, and when completely lowered, the rotating table 100 and the substrate may be externally exposed, and the treatment solution may not be collected. The collection cup 210 may have a dome shape including a roof of which an upper surface is open so that, when the collection cup 210 is completely lowered, the substrate may be completely exposed, and a flow of the treatment solution supplied to the substrate is not interfered, and when the collection cup 210 is completely lifted, the treatment solution which is supplied to the substrate and spattered is collected.

The collection cup 210 may be provided as a plurality of collection cups 210 to collect various treatment solutions. For example, the collection cups 210 may include a first collection cup 211 provided to surround the rotating table 100, a second collection cup 212 provided outside the first collection cup 211 to surround the first collection cup 211, and a third collection cup 213 provided outside the second collection cup 212 to surround the second collection cup 212. In this case, the first collection cup 211 may be lifted to collect a first treatment solution, the second collection cup 212 may be lifted to collect a second treatment solution, and the third collection cup 213 may be lifted to collect a third treatment solution.

The collection cup 210 may have the dome shape to prevent the treatment solution from externally spattering and include the roof of which the upper surface is open. In this case, a structure in which, when adjacent collection cups among the first to third collection cups 211 to 213 are lifted or lowered together, at least one portions of the roofs of the collection cups 210 overlap, may be formed. FIG. is a view illustrating a state in which all the upper surfaces of the first to third collection cups 211 to 213 are open, and the first to third collection cups 211 to 213 are completely lowered to completely expose the rotating table 100.

The lifting shaft 220 is connected to the collection cup 210 and the gear box 240, which will be described below, and is a component that is lifted or lowered by the gear box 240 to lift or lower the collection cup 210. In the present embodiment, the lifting shaft 220 may be provided as one pair of lifting shafts 220 connected to any one side of the collection cup 210 and the other side facing the one side. For example, the collection cup 210 may have a ring shape surrounding the rotating table 100, and one pair of lifting shafts 220 may be connected at locations symmetrical with respect to a central point of the ring. As one pair of lifting shafts 220 support one collection cup 210, even when the collection cup 210 collects the treatment solution, a height and balance of the collection cup 210 may be maintained.

One end of the lifting shaft 220 may be connected to the collection cup 210, and the other end thereof may be connected to the gear box 240. Preferably, the one end may be connected to a lower surface of the collection cup 210, and the other end may be connected to an upper surface of the gear box 240. The lifting shaft 220 may straightly extend in a direction parallel to the height direction of the substrate processing apparatus 1. Accordingly, the gear box 240, the lifting shafts 220, and the collection cups 210 may be disposed to be collinear or coplanar with each other side by side, and in a side view of the substrate processing apparatus 1, the lifting shaft 220 and the gear box 240 may be disposed under the collection cup 210. In this case, an apparatus for lifting and lowering operations of the collection cup 210 may not be disposed outside the collection cup 210 around the rotating shaft 120 of the rotating table 100, space utilization of the substrate processing apparatus 1 can be maximized, and a size of the entire apparatus can be reduced.

The lifting shaft 220 may be connected to a lifting part 242 through an upper portion of the gear box 240 which will be described below, and as a driving part 243 lifts or lowers the lifting part 242, the lifting shaft 220 may be lifted or lowered together with the lifting part 242. The lifting shaft 220 may be coupled to the gear box 240 through an opening (not shown) provided in the housing 140, and the separation prevention member 230 may be provided in the opening between the housing 140 and the lifting shaft 220. The separation prevention member 230 may secure lifting and lowering operations of the lifting shaft 220 and prevent the lifting shaft 220 from tilting with respect to the height direction of the substrate processing apparatus 1. In the present embodiment, the lifting shaft 220 may be provided as one pair of lifting shafts 220 so that one ends may support both sides of the collection cup 210, the other ends of the lifting shafts 220 may be connected to the gear box 240, and tilting of the lifting shafts 220 may be prevented by the separation prevention member 230 between the one ends and the other ends to stably maintain the height and balance even when the collection cup 210 collects the treatment solution.

The collection cup 210 may store the treatment solution collected in the internal space and includes a collection hole (not shown) in the lower surface or a side surface thereof for discharging the stored treatment solution. When the collection hole and the lifting shaft 220 are provided at the lower surface of the collection cup 210, the lifting shaft 220 and the collection hole may be disposed at alternate locations in the lower surface of the collection cup 210. The collection hole of the collection cup 210 may be connected to a collection hole 141 or flushing hole 142 provided in the housing 140. The treatment solution may be supplied to the outside of the substrate processing apparatus 1 or a separate storage container provided in the substrate processing apparatus 1 through the collection hole 141 or flushing hole 142 of the housing 140.

When the collection cup 210 are provided as the plurality of collection cups 210, the lifting shaft 220 may also be provided as a plurality of lifting shafts 220 to be correspondingly coupled to the collection cups 210. For example, when the collection cups 210 include the first to third collection cups 211 to 213, the lifting shafts 220 may include a first lifting shaft 221 of which one end is connected to the first collection cup 211, a second lifting shaft 222 of which one end is connected to the second collection cup 212, and a third lifting shaft 223 of which one end is connected to the third collection cup 213. The other end of each of the first lifting shaft 221 to the third lifting shaft 223 may be connected to the gear box 240, specifically, connected to the corresponding lifting part 242. As described above, each of the first lifting shaft 221 to the third lifting shaft 223 may be provided as pairs of first lifting shafts 221 and third lifting shafts 223, respectively, one pair of lifting shafts 220 may be synchronized with each other to be lifted or lowered at the same time to lift or lower the collection cup 210 connected to one pair of lifting shafts 220 in a state in which the collection cup 210 is not tilted in any one direction.

The gear box 240 may include a gear box housing 241 connected to the housing 140 of the substrate processing apparatus 1 and the lifting part 242 and the driving part 243 provided in an internal space thereof. In the present embodiment, the gear box 240 may be provided as one pair of gear boxes 240 which are disposed at locations corresponding to one pair of lifting shafts 220, and in a side view of the substrate processing apparatus 1, one pair of gear boxes 240 may be disposed under the collection cup 210.

Although not illustrated in the drawings, the gear box housing 241 may be disposed in the housing 140 of the substrate processing apparatus 1, may form an exterior of the gear box 240, and may include the lifting part 242 and the driving part 243 therein.

The driving part 243 may include a motor, which will be described below, and a gear to lift or lower the lifting part 242 in the gear box 240, and as the lifting part 242 is lifted or lowered, the lifting shaft 220 connected to the lifting part 242 may also be lifted or lowered. Although not illustrated in the drawings, the driving part 243 may be provided as a plurality of driving parts 243 to correspond one-to-one to the lifting shafts 220. That is, when the plurality of lifting shafts 220 are connected to one gear box 240, a plurality of lifting parts 242 and the plurality of driving parts 243 corresponding one-to-one to the plurality of lifting shafts 220 may be provided in the one gear box 240. The lifting part 242 may be physically engaged with and connected to the motor and the gear of the driving part 243 so that lifting and lowering operations in which an error is minimized or removed may be implemented when compared to control using the conventional pneumatic cylinder, and as one pair of lifting parts 242 are provided, synchronization with other pairs of lifting parts 242 can be easily implemented. More specific operation of the lifting part 242 and the driving part 243 will be described below.

The gear box in the substrate processing apparatus according to one embodiment of the present disclosure will be more specifically described with reference to FIGS. 7 and 8. FIGS. 7 and 8 are views illustrating all the plurality of lifting shafts 220 connected to the gear box 240 and separation prevention members 230 for describing operation of the gear box 240, which illustrates a state in which one side of one pair of lifting shafts 220 is provided with two lifting shafts 220 and the gear box 240 is connected to a total of three pairs of lifting shafts 220.

Referring to FIGS. 7 and 8, the gear box 240 may include the gear box housing 241, the lifting part 242, and the driving part 243.

The gear box housing 241 provides a space in which the lifting part 242 and the driving part 243 are disposed. The gear box housing 241 may have a shape of which at least a portion of an upper surface is open and may be coupled to the housing 140 of the substrate processing apparatus 1 through the upper surface, but is not limited thereto. A window for monitoring whether the lifting part 242 and the driving part 243 disposed in the gear box housing 241 operate normally or not may also be provided in one side surface of the gear box housing 241.

The gear box housing 241 may accommodate the driving part 243 therein, and a portion of the driving part 243 may protrude from the gear box housing 241. The driving part 243 may include a motor 2431, a motor shaft 2432, and a gear 2433. Referring to FIG. 7, the motor 2431 may be disposed to protrude outward through one side surface of the gear box housing 241 and connected to an external power source (not shown).

The motor 2431 may generate driving power using electricity, and operation thereof may be controlled according to an electrical signal. For example, the motor 2431 may be a servo motor of which a rotation direction may be controlled according to a pulse signal. The motor 2431 may rotate the motor shaft 2432 connected to the motor 2431 about a rotation axis in a direction perpendicular to the height direction of the substrate processing apparatus 1. The motor shaft 2432 may be disposed parallel to a direction perpendicular to the rotating shaft 120 of the rotating table 100 and may rotate. That is, the motor shaft 2432 and the lifting shaft 220 may be disposed in directions perpendicular to each other. One end of the motor shaft 2432 may be connected to the motor 2431, and the other end thereof may be connected to the gear 2433.

The motor 2431 may be provided in each of one pair of gear boxes 240 to be provided as one pair of motors 2431, and one pair of motors 2431 may be connected to one pair of lifting shafts 220 through one pair of lifting parts 242. Accordingly, when one pair of lifting shafts 220 are provided as a plurality of pairs of lifting shafts 220, one pair of lifting parts 242 and one pair of motors 2431 may also be provided as a plurality of pairs of lifting parts 242 and a plurality of pairs of motors 2431 and connected to the corresponding lifting shafts 220, respectively. One pair of motors 2431 may be synchronized with each other and may lift or lower the lifting parts 242 connected to the motors 2431 at the same time. For example, in one gear box 240, three motors 2431 may be provided, and three lifting parts 242 connected to the motors 2431 may be provided.

FIG. 8 is a cross-sectional view illustrating the gear box 240 along a virtual line AA' shown in FIG. 7. The gear 2433 may be connected to the motor 2431 through the motor shaft 2432 and may transmit power received from the motor 2431 to the lifting shaft 220. Specifically, the gear 2433 refers to a means capable of receiving a rotating force from the motor shaft 2432, changing a direction of the rotating force, and transmitting the rotating force as power required for lifting or lowering the lifting part 242, and the gear 2433 may be a bevel gear, a rack/pinon gear, or a worm gear but is not limited there.

The lifting part 242 may include a screw 2421, nuts 2422 and 2424, and a lifting plate 2423. One end of the gear 2433 may be connected to the motor shaft 2432, and the other end thereof may be connected to the screw 2421 of the lifting part 242 to transmit power of the motor shaft 2432 to the screw 2421 so as to rotate the screw 2421. The screw 2421 may be connected to the motor 2431 through the gear 2433 and may rotate about an axis perpendicular to the motor shaft 2432. The screw 2421 may be formed to extend from the gear 2433 in the height direction of the substrate processing apparatus 1 to a level of the gear box housing 241. Although not illustrated in the drawing, the screw 2421 may include a thread formed on an outer circumferential surface thereof and the lifting plate 2423 and the nuts 2422 and 2424 may be screw-coupled to the thread of the outer circumferential surface of the screw 2421.

The nuts 2422 and 2424 may include one or more of an upper nut 2422 and a lower nut 2424 based on a location of the lifting plate 2423 at the screw 2421, each or both of the upper nut 2422 and the lower nut 2424 may be disposed close to or in contact with the lifting plate 2423 to suppress rotation of the lifting plate 2423. In this case, even when the screw 2421 rotates, the lifting plate 2423 moves along the thread without rotating with the screw 2421 to be lifted or lowered in the height direction of the substrate processing apparatus 1.

The lifting plate 2423 may be a plate-shaped member extending in a direction perpendicular to the screw 2421 and may be screw-coupled to the screw 2421 though an opening (not shown) provided at a central portion thereof. In the lifting plate 2423, the lifting shaft 220 may be connected to a portion beside the opening, and a rotating axis of the screw 2421 and the lifting shaft 220 may be disposed parallel to each other. Preferably, the rotating axis of the screw 2421 and the lifting shaft 220 may be disposed coplanar with each other side by side.

Preferably, one pair of lifting shafts 220 may be provided with two lifting shafts 220 connected to one side of the collection cup 210 and two lifting shafts 220 connected to the other side opposite to the one side, and two lifting shafts 220 connected to the one side of the collection cup 210 may be connected to the lifting plate 2423 with the opening interposed therebetween. In this case, the lifting plate 2423 screw-coupled to the screw 2421 may stably support two lifting shafts 220 while always maintaining a verticality with respect to the screw 2421 and a horizontality with respect to a ground surface on which the substrate processing apparatus 1 is disposed, and two lifting shafts 220 supports one shaft of the collection cup 210 so that the collection cup 210 may be lifted or lowered while maintaining balance. That is, the gear box 240 controls a relative height of the lifting plate 2423 with respect to the screw 2421 of the lifting part 242, and as the lifting plate 2423 is lifted or lowered in a longitudinal direction of the screw 2421, one or more lifting shafts 220 connected to the lifting plate 2423 also are lifted or lowered to ultimately lift or lower the collection cup 210.

Movement of the treatment solution collecting part in the substrate processing apparatus 1 according to the embodiment will be more specifically described with reference to the above description and FIGS. 5 and 9 to 11.

The treatment solution collecting part 200 of the substrate processing apparatus 1 according to the present embodiment may include the first collection cup 211, the second collection cup 212, the third collection cup 213, and three pairs of lifting shafts 220 connected to the corresponding collection cups 210. One ends of one pair of lifting shafts 220 may be connected to one side and the other side opposite to the one side of the collection cup 210, and the other ends thereof may be connected to one pair of gear boxes 240. As three pairs of lifting shafts 220 are provided, in one pair of gear boxes 240, a total of three pairs of lifting parts 242 and the driving parts 243 may be provided and connected to the corresponding lifting shafts 220. One pair of driving parts 243 may be synchronized and operated, and operation of three pairs of driving part 243 may be integrally controlled.

As in FIG. 5, the treatment solution collecting part 200 of the substrate processing apparatus 1 may maintain an initial state in which all the collection cups 210 are lowered. The substrate S may be disposed between the chuck pins 110 of the rotating table 100 and may enter states as in FIGS. 9 to 11. Hereinafter, substrate treatment operation will be described in an order from FIG. 9 to FIG. 11 but is not limited thereto, and may be performed according to various combinations of states illustrated in FIGS. 9 to 11.

Referring to FIG. 9, after the substrate S is disposed on the substrate processing apparatus 1, all the first to third collection cups 211 to 213 may be lifted. All three pairs of driving parts 243 may be driven to lift three pairs of lifting parts 242, and accordingly, a state in which all three pairs of lifting shafts 221 to 223 and the collection cups 211 to 213 are lifted with respect to the rotating table 100 may be maintained. When viewed from the center of the rotating table 100 toward the outside of the rotating table 100, only an internal space for storing a treatment solution of the first collection cup 211 is open, and internal spaces of the second collection cup 212 and the third collection cup 213 may be blocked by the first collection cup 211. In this state, when the first treatment solution is sprayed onto a surface of the substrate S through a treatment solution supply part (not shown), the first treatment solution flows along surfaces of the substrate S and the rotating table 100 and is introduced into the internal space of the first collection cup 211.

Referring to FIG. 10, after the first treatment solution is completely sprayed, a state in which the second collection cup 212 and the third collection cup 213 are lifted may be maintained, and the first collection cup 211 may be lowered. Only one pair of driving parts 243 connected to the first collection cup 211 may be driven to lower the first collection cup 211 until the rotating table 100 and the substrate S are completely exposed. When viewed from the center of the rotating table 100 toward the outside of the rotating table 100, only the internal space for storing the treatment solution of the second collection cup 212 may be open, and the internal space of the third collection cup 213 may be blocked by the second collection cup 212. In this state, when the second treatment solution is sprayed onto the surface of the substrate S through the treatment solution supply part, the second treatment solution flows along the outer surfaces of the substrate S, the rotating table 100, and the first collection cup 211 and is introduced into the internal space of the second collection cup 212.

Referring to FIG. 11, after the second treatment solution is completely sprayed, a state in which the third collection cup 213 is lifted may be maintained, and the second collection cup 212 may be lowered. Only one pair of driving parts 243 connected to the second collection cup 212 may be driven to lower the second collection cup 212 until the rotating table 100 and the substrate S are completely exposed. In a case in which the second collection cup 212 provides the internal space for storing the second treatment solution and the third collection cup 213 provides the internal space for storing the third treatment solution, when viewed from the center of the rotating table 100 toward the outside of the rotating table 100, only the internal space for storing the treatment solution of the third collection cup 213 may be open. In this state, when the third treatment solution is sprayed onto the surface of the substrate S through the treatment solution supply part, the third treatment solution flows along the outer surfaces of the substrate S, the rotating table 100, and the second collection cup 212 and is introduced into the internal space of the second collection cup 212 or the third collection cup 213.

Referring to FIG. 5 again, after the third treatment solution is completely sprayed, a state in which even the third collection cup 213 is lowered so that all the collection cups 210 are lowered may be maintained. The treated substrate S may be removed from the rotating table 100, and a new substrate requiring treatment may be disposed and, the above-described process may be repeatedly performed.

The above-described substrate processing apparatus according to the present embodiment may include the collection cups capable of being lifted and lowered to collect the treatment solutions used when the substrate is treated, and may more precisely control heights of the collection cups using the motor instead of the conventional pneumatic cylinder, and even when the substrate processing apparatus is repeatedly used, an error may not occur, or an error may be easily corrected.

In addition, the present disclosure may allow step-by-step lifting or lowering adjustment of the outermost third collection cup among the plurality of collection cups included in the substrate processing apparatus to be performed using the motor and allow the liftable height of the outermost third collection cup to be higher than those of the collection cups disposed thereinside so that the outermost third collection cup maximally receives a scattering chemical solution.

In addition, the substrate processing apparatus may include the plurality of collection cups and several pairs of corresponding motors so that precise control is implemented to prevent a plurality of treatment solutions from being mixed with each other.

Meanwhile, a substrate processing apparatus of the present disclosure may be implemented through still another embodiment. FIG. 12 is a view illustrating one cross section of a substrate processing apparatus according to still another embodiment of the present disclosure, and FIG. 13 is a top view illustrating the substrate processing apparatus according to still another embodiment of the present disclosure. FIGS. 14A and 14B are exemplary views illustrating a state in which the substrate processing apparatus is driven according to still another embodiment of the present disclosure, and FIG. 15 is a view illustrating a state in which a connecting shaft 270 is synchronously engaged with a rack 262 in the substrate processing apparatus according to still another embodiment of the present disclosure, and FIG. 16 is a view illustrating a state in which a collection cup is connected to the substrate processing apparatus according to still another embodiment of the present disclosure.

As illustrated in FIGS. 12 to 16, according to still another embodiment of the present disclosure, the substrate processing apparatus of the present disclosure may include a collecting part, a collection cup, and one pair of lifting shafts 220 according to above-described one embodiment and include a hydraulic piston 250 and a rack gear 261 instead of a gear box.

In addition, according to still another embodiment of the present disclosure, in order to lift and lower the substrate processing apparatus, the hydraulic piston 250 and the rack gear 261 are provided instead of the gear box, and in the embodiment described below, the same or similar components as or to previous embodiments will be assigned with the same or similar reference numerals and the descriptions thereof will be replaced by the previous corresponding descriptions.

First, the lifting shaft 220 of the substrate processing apparatus according to still another embodiment of the present disclosure may be provided as one pair of lifting shafts 220 connected to any one side and the other side opposite to the any one side of a collection cup. In addition, any one pair of lifting shafts 220 may be located to support one collection cup.

In addition, as one pair of lifting shafts 220 support one collection cup, a height of the collection cup may be stably supported, and thus the collection cup may not be tilted, and a left-right balance may be maintained.

Meanwhile, referring to FIGS. 12 to 14B, in the substrate processing apparatus according to still another embodiment of the present disclosure, one hydraulic piston 250 and a plurality of rack gears 261 may be located on one pair of lifting shafts 220.

First, the hydraulic piston 250 of the substrate processing apparatus according to still another embodiment of the present disclosure may be provided with a cylinder which receives a pneumatic or hydraulic pressure and a piston vertically reciprocally moved by a pressure of a fluid received by the cylinder. A screw 2421 may be located on an upper end of the cylinder of the hydraulic piston 250, and the hydraulic piston 250 may be provided as a structure connected to a lifting plate 2423 by the screw 2421.

The substrate processing apparatus according to still another embodiment of the present disclosure may be provided so that the hydraulic piston 250 is connected to one pair of lifting shafts 220 and also connected to one pair of oppositely located lifting shafts 220 to serve to left-right horizontally lift the lifting shafts 220.

Specifically, the hydraulic piston 250 of the present disclosure may be provided to be connected to each of one pair of frames spaced apart from and facing each other and to serve to lift the lifting shafts 220.

Then, the substrate processing apparatus according to still another embodiment of the present disclosure may be provided with the rack gear 261 for synchronous lifting of one pair of lifting shafts 220. Specifically, the substrate processing apparatus according to still another embodiment of the present disclosure may be provided so that a rack gear is provided with the rack gear 261 and the rack 262 and formed in a saw shape, and as the rack gear is lifted or lowered in a longitudinal direction, one pair of lifting shafts 220 connected to the lifting plate 2423 are also lifted or lowered, and a collection cup 210 is ultimately lifted or lowered. In addition, the rack gear 261 and the rack 262 are provided so that the lifting shaft 220 is not twisted.

Meanwhile, referring to FIGS. 14A to 15, in the connecting shaft 270 of the present disclosure, the saw shape of the rack gear 261 is located at each of one end and the other end thereof, and the connecting shaft 270 is provided to be engaged with one pair of lifting shafts 220 through the rack gears 261 and to serve to control one pair of lifting shafts 220 to be lifted or lowered with a constant interval. Specifically, in the connecting shaft 270 according to still another embodiment of the present disclosure, the rack gears 261 capable of lifting or lowering the lifting shafts 220 are provided at one end and the other end thereof, the rack gear 261 formed at the one end may be connected to any one of one pair of lifting shafts 220, and the rack gear 261 formed at the other end may be connected to the remaining one lifting shaft 220.

In addition, in a connecting frame and the lifting shaft 220 of the present disclosure, a length and an area of a saw formed on the lifting shaft 220 may be the same as a length and an area of the rack 262 formed on the remaining one lifting shaft 220 to maintain a left-right horizontality and to lift or lower the collection cup to a predetermined height. In addition, as the rack gear 261 of the connecting shaft 270 and the rack 262 according to still another embodiment of the present disclosure are formed with a predetermined distance therebetween, lifting synchronization can be implemented.

FIGS. 14A and 14B are exemplary views illustrating a state in which the substrate processing apparatus is driven according to still another embodiment of the present disclosure;

Referring to FIGS. 14A and 14B, as the cylinder of the hydraulic piston 250 of the substrate processing apparatus according to still another embodiment of the present disclosure is lifted, the rack 262 located on the connecting shaft 270 and the rack gear 261 may be lifted while maintaining a constant distance therebetween, and the lifting plate may be lifted while maintaining a horizontal angle.

Meanwhile, one hydraulic piston 250 and the plurality of rack gears 261 may be located on one pair of lifting shafts 220 of the present disclosure, and the hydraulic piston 250 and the plurality of rack gears 261 may be located opposite to one pair of lifting shafts 220.

In addition, the hydraulic piston 250 and a gear unit 260 located opposite to each other may be provided to be lifted or lowered so that first to third collection cups are individually lifted. In this case, the rack gear of the present disclosure may more precisely control a height of the collection cup through the rack gear 261 of the connecting shaft 270 and the rack 262.

As described above, the rack gear 261 of the connecting shaft 270 and the rack 262 according to still another embodiment of the present disclosure can have an effect of improving a transfer efficiency because the attitudes of the collection cup 210 and the lifting plate 2423 are uniformly and stably controlled without a deviation.

Meanwhile, the movement of a treatment solution collecting part of the substrate processing apparatus according to still another embodiment of the present disclosure will be specifically described with reference to FIG. 16.

In the treatment solution collecting part of the substrate processing apparatus which is another example of the present disclosure, the collection cup 210 may be provided as three collection cups 210, and one pair of lifting shafts 220 may be provided on each of the collection cups 210. In addition, one ends of the lifting shafts 220 located on one pair of lifting shafts 220 may be connected to one side and the other side opposite to the one side of the collection cup 210, and the other ends thereof may be coupled to the hydraulic piston 250 and the rack gear 261. In addition, the lifting shaft 220 corresponding to the hydraulic piston 250 and the rack gear 261 may be provided to be synchronized with and operated by the gear unit 260 and integrally controlled.

Meanwhile, in the substrate processing apparatus according to still another embodiment of the present disclosure, when the collection cup 210 provided as three collection cups 210 is lifted, the lifting shafts 220 are also lifted, and accordingly, a state in which all the collection cups 210 and the lifting shafts 220 are lifted with respect to a rotating table 100 may be maintained, and then, the same process as one embodiment may be repeatedly performed on a substrate requiring treatment.

Meanwhile, as the substrate processing apparatus of still another embodiment of the present disclosure is provided with the hydraulic piston 250 and the rack gear 261 connected thereto by the connecting shaft 270, the substrate processing apparatus of which a left-right horizontal state may be firmly maintained may be implemented.

According to the present disclosure, a substrate processing apparatus can prevent a chemical solution from being scattered to the outside by allowing three-stage adjustment for lifting or lowering of an outermost collection cup through a motor unlike a collection cup which is disposed inward and in which only two-stage adjustment is possible through a hydraulic method.

The present disclosure is not limited to the above-described embodiments and may include combinations of the above embodiments or combinations of at least any one among the above embodiments and a known technology as additional embodiments.

The present disclosure has been described in detail with reference to specific embodiments. However, the specific embodiments are to specifically describe the present disclosure, and the present disclosure is not limited thereto. It should be clear to those skilled in the art that modifications and improvements thereof may be made within the scope of the disclosure.

Any simple modifications and alterations of the present disclosure fall within the scope of the present disclosure, and the specific scope of the present disclosure will be clear by the appended claims.

What is claimed is:

1. A substrate processing apparatus provided with a rotating table for supporting and rotating a substrate and collection cups for collecting treatment solutions sprayed onto the substrate, the substrate processing apparatus comprising:

the collection cups disposed outside the rotating table and each provided therein with a space for collecting the treatment solution;

one pair of lifting shafts connected to each of the collection cups; and one pair of driving modules connected to each of the lifting shafts, wherein an outermost third driving part among the driving modules is a motor driving type, and an inner driving module disposed inside the third driving part is a hydraulic driving type, and a liftable height of a third collection cup connected to the third driving part and lifted by a third lifting shaft is higher than a liftable height of a collection cup lifted by the inner driving module, and wherein height adjustment of the third collection cup in three or more stages is allowed through the third driving part.

2. The substrate processing apparatus of claim 1, wherein the inner driving module includes:

a second driving part disposed inside the third driving part; and a first driving part disposed inside the second driving part.

3. The substrate processing apparatus of claim 2, wherein the collection cup includes:

a second collection cup connected to the second driving part through a second lifting shaft and disposed inside the third collection cup; and a first collection cup connected to the first driving part through a first lifting shaft and disposed inside the second collection cup to surround the rotating table.

4. The substrate processing apparatus of claim 1, wherein the one pair of lifting shafts are synchronized with each other to lift or lower the one pair of lifting shafts at the same time to adjust a relative height of the collection cup with respect to the rotating table.

5. The substrate processing apparatus of claim 1, wherein:

one end of each of the one pair of lifting shafts is connected to a lower surface of the collection cup; and the other end of each of the one pair of lifting shafts is connected to an upper surface the driving modules.

6. The substrate processing apparatus of claim 5, wherein the third driving part includes:

a motor which generates driving power;

a screw that is connected to the motor and rotates about a rotating axis perpendicular to a rotating shaft of the motor;

a lifting plate which is screw-coupled to the screw and to which the other end of the lifting shaft is connected; and a nut which suppresses rotation of the lifting plate, wherein the third lifting shaft is lifted or lowered by adjusting a relative height of the lifting plate with respect to the screw.

7. The substrate processing apparatus of claim 6, wherein the rotating axis of the screw and the third lifting shaft are disposed parallel to each other.

\*  \*  \*  \*  \*